(12) United States Patent
Mund et al.

(10) Patent No.: US 7,368,758 B2
(45) Date of Patent: May 6, 2008

(54) METHOD FOR HERMETICALLY HOUSING OPTICAL COMPONENTS, AND OPTICAL COMPONENTS PRODUCED ACCORDING TO SAID METHOD

(75) Inventors: Dietrich Mund, Obersüßbach (DE); Bernd Hammer, Landshut (DE); Robert Hettler, Kumhausen (DE); Klaus Schachtelbauer, Kumhausen (DE); Edeltraud Sausenthaler, Ergolding (DE); Markus Maier, Landshut (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 10/515,034

(22) PCT Filed: Apr. 9, 2003

(86) PCT No.: PCT/EP03/03649

§ 371 (c)(1),
(2), (4) Date: May 11, 2005

(87) PCT Pub. No.: WO03/103358

PCT Pub. Date: Dec. 11, 2003

(65) Prior Publication Data

US 2005/0224827 A1 Oct. 13, 2005

(30) Foreign Application Priority Data

Jun. 3, 2002 (DE) .................. 102 24 710

(51) Int. Cl.
*H01L 29/22* (2006.01)
(52) U.S. Cl. .................. 257/99; 257/680; 257/E23.023; 438/26; 438/64

(58) Field of Classification Search .................. 438/22, 438/64, 26, 65; 257/99, 433, 680, 704, E23.023, 257/E21.449, E21.509
See application file for complete search history.

(56) References Cited

U.S. PATENT DOCUMENTS

| 3,983,771 | A | * | 10/1976 | Bonaddio | 83/884 |
|---|---|---|---|---|---|
| 5,140,384 | A | * | 8/1992 | Tanaka | 257/36 |
| 5,255,333 | A | * | 10/1993 | Althaus et al. | 385/33 |
| 5,878,069 | A | | 3/1999 | Kamibayashi et al. | 372/36 |
| 5,907,162 | A | * | 5/1999 | Maruyama | 257/98 |

(Continued)

FOREIGN PATENT DOCUMENTS

| DE | 3729411 A1 | | 3/1989 |
|---|---|---|---|
| DE | 3830149 A1 | | 3/1990 |
| GB | 1185752 A | * | 3/1970 |
| WO | WO01/99101 A2 | * | 12/2000 |

*Primary Examiner*—T. N. Quach
(74) *Attorney, Agent, or Firm*—Ohlandt, Greeley, Ruggiero & Perle, L.L.P.

(57) ABSTRACT

A method is provided for producing a housing body for optoelectronic components that are reliable and inexpensive. The method creates a hermetic joint between a metal sleeve and a glass pane by joining together a housing element and a preferably metallic housing arrangement. The housing element and the housing arrangement are brought into contact with a glass solder, before the housing element and housing arrangement are joined. The glass solder is applied as a shapeable material, in particular as a paste. The glass solder is pre-vitrified and has its shape fixed by energy being introduced at least once, in particular as a result of organic constituents being burnt off. After the housing element has been inserted into the housing arrangement, a joint that is hermetic at least in regions, is produced between the glass pane and housing arrangement.

24 Claims, 5 Drawing Sheets

U.S. PATENT DOCUMENTS

| | | | |
|---|---|---|---|
| 6,420,205 B1 * | 7/2002 | Sawai | 438/65 |
| 6,536,958 B2 * | 3/2003 | Liu | 385/92 |
| 6,627,814 B1 * | 9/2003 | Stark | 174/539 |
| 2002/0134138 A1 * | 9/2002 | Philipp et al. | 73/35.07 |

* cited by examiner

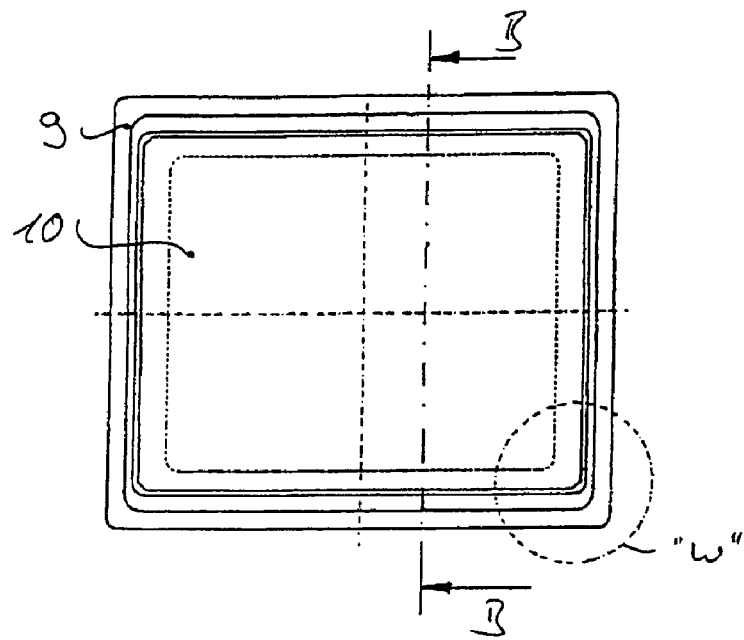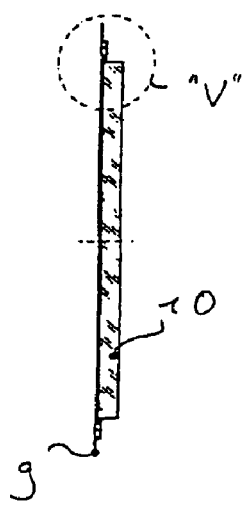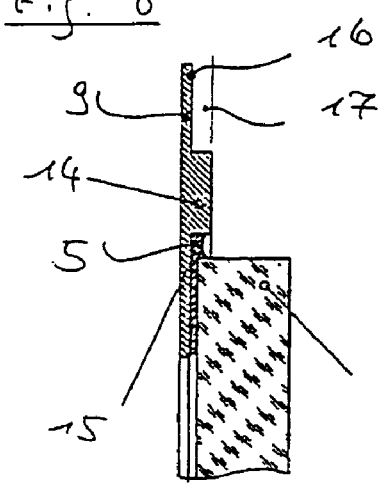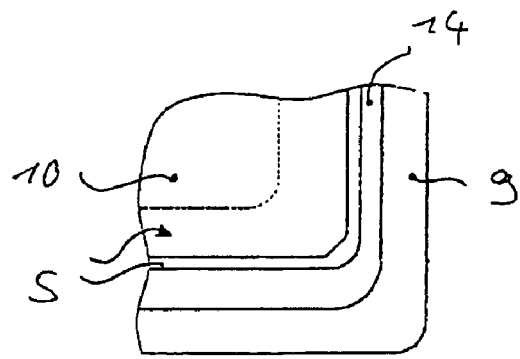

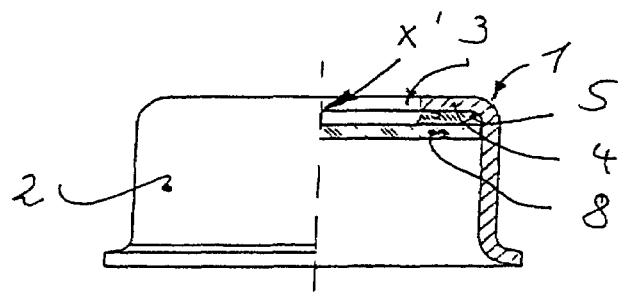
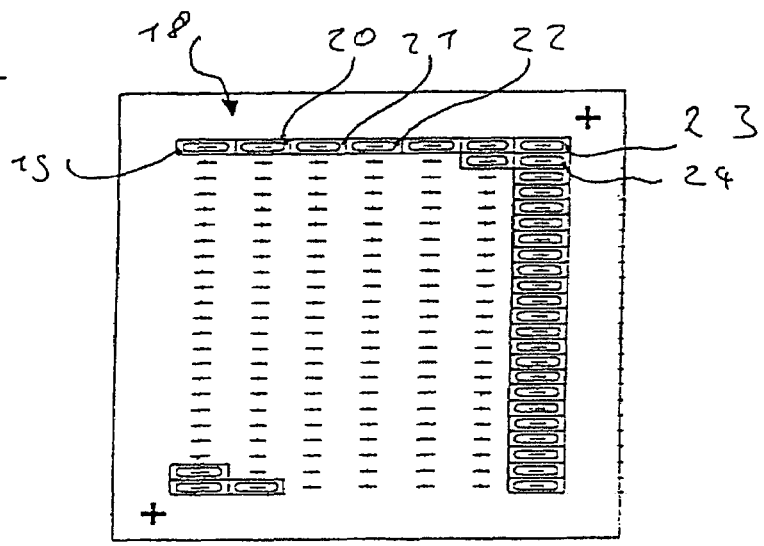
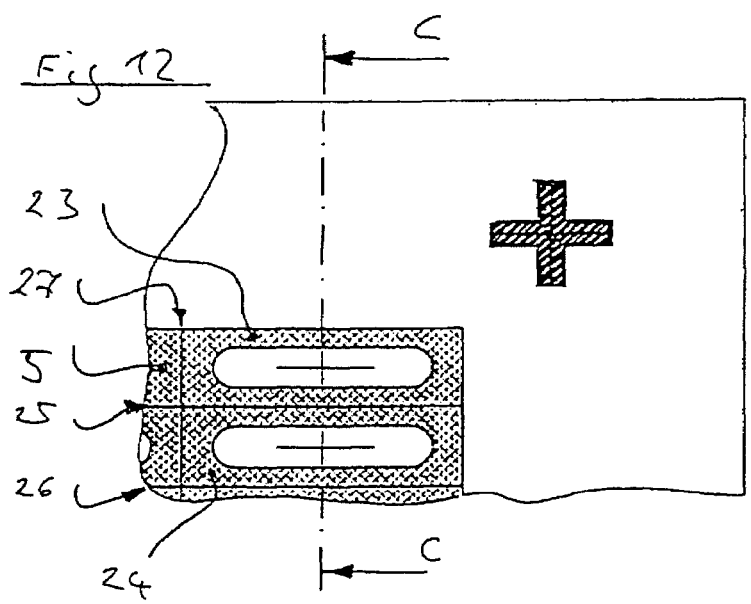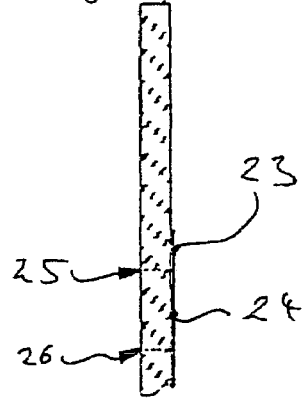

METHOD FOR HERMETICALLY HOUSING OPTICAL COMPONENTS, AND OPTICAL COMPONENTS PRODUCED ACCORDING TO SAID METHOD

BACKGROUND OF THE INVENTION

1. Field of the Invention

The invention relates to a process for hermetically housing optical components, in particular for producing a housing body or parts thereof, in which preferably optoelectronic components are hermetically encapsulated or packaged, and also relates to optical components produced in accordance with the process.

2. Description of Related Art

Hermetically packaged or encapsulated housings are often used to protect sensitive components, such as lasers or photodiodes, from environmental influences and help to ensure a sufficient service life of these components.

Hitherto, glass-metal joining technologies which are known per se to the person skilled in the art and in which the housing comprises a metal component and a glass component acting as a window, which are hermetically joined to one another, have been used to produce housings/optical caps of this type.

Housings of this type often comprise a sleeve-like metal body and a glass pane which can be received in the sleeve and serves as a window. In the known production of housings/optical caps of this type, the metal and glass components were joined by means of a glass solder arranged in the form of a ring which was used as a sintered shaped part. In this case, before the components were actually joined together, the glass solder shaped part had to be produced in a separate operation using sintering technology. Then, the shaped part was inserted in an accurately fitting manner into the sleeve-like metal component and covered with the round glass pane. This was followed by the fusion operation in which sleeve and glass pane were joined to one another in a hermetic and force-fitting manner. To ensure the desired hermetic sealing of the housing, the position and shape of the glass solder between metal sleeve and glass pane in each case had to be adapted in an appropriate way. Tight tolerances have to be observed both for the housing components and for the glass solder. Therefore, considerable attention has to be paid when producing and inserting the glass solder shaped parts, which is time-consuming and expensive. Often, in particular in the case of inclined joining surfaces, it was nevertheless impossible to prevent high scrap rates, since any running of the glass solder shaped parts led to inaccurate application.

Furthermore, this technology is confronted with pronounced feasibility limits as soon as the glass window is no longer required in the form of a round disk, but rather with a polygonal contour, in particular as a right angle or in other shapes which deviate from a simple round geometry or the surface which is to be covered with glass solder is not horizontal or convex in shape. On account of their shape, there are very considerable restrictions on the glass solder shaped parts which can be produced by sintering technology, especially with the degree of accuracy required.

The conventional process is also unsuitable for optical caps, the windows of which are arranged obliquely in the metallic sleeve, on account of an excessive quantity of solder and on account of the solder ring slipping before it is melted or during the soldering operation.

BRIEF SUMMARY OF THE INVENTION

The invention is based on the object of developing an accurate process, which can be used for various housing geometries, of the type described in the preamble of claim 1, which allows a reliable and inexpensive, preferably hermetic, join to be produced between metal sleeve and glass pane.

This object is achieved by a process having the features of claim 1, and by a component having the features of claim 19.

There are considerable advantages if the glass solder is applied as a shapeable material, in particular as a paste, before the housing element and housing arrangement are joined and the glass solder is pre-vitrified and its shape fixed by energy being introduced at least once, in particular as a result of organic constituents being burnt off, since it is possible for virtually any shape, both two-dimensional planar shapes and convex shapes, to be provided with glass solder in a locally accurately defined manner. After the housing element has been inserted into the housing arrangement, it is then possible to produce a hermetic join, at least in regions, between pane and housing arrangement by heating.

In a particularly preferred embodiment, the housing element comprises a window which consists of glass, and the housing arrangement comprises a housing cap.

The glass solder paste can advantageously be applied at least in regions to the glass pane and/or the housing cap, it being possible to exactly set the height of glass solder applied and also the quantity of glass solder applied by means of the glass solder being applied more than once.

If the glass solder paste is applied into the housing cap to a bearing surface arranged in the peripheral region, it is possible, given a continuous arrangement of the glass solder, to produce a completely hermetic join.

It is useful, in particular when relatively large quantities of glass solder are used, if the glass solder paste is applied to the bearing surface in the housing cap in a solder region which is delimited from the remainder of the bearing surface by a bead.

Surprisingly, the glass solder paste can be applied to an antireflection coating or scratch proof layer which is arranged on the surface of the housing element, in particular of the window, so that it is possible to mount high-quality optical elements, such as for example lenses, spherical lenses, cylindrical lenses or also optical filters, such as DWDM filters or gratings.

It is advantageous if the shaping of the glass solder paste, in particular the cross section or the thickness of an applied section, is influenced and/or set by setting the Theological properties of the paste, since in this case the viscosity of the glass solder paste can be adapted to the particular mounting conditions; thinner ribbons of solder can be produced at lower viscosities and thicker ribbons of solder at higher viscosities. Furthermore, the running of the applied ribbon of solder can be influenced or matched to the mounting process by means of its viscosity.

If the glass solder paste is applied in metered form by means of a metering apparatus, in particular a dispenser and preferably by means of a needle dispenser, it is even possible for obliquely running surfaces or surfaces which have a complex three-dimensional profile to be reliably provided with glass solder in an accurately predefined way. As a result, by way of example, even cylindrical surfaces of housings or cylindrical lenses, for example in optical recording or writing systems which scan in the x and/or y directions, to be joined to one another. It is extremely advantageous if the metering apparatus is an annular or rectangular dispenser provided with a nozzle, since, given a suitable application geometry, it is then possible for a single, metered and preferably time-/pressure-controlled application to suffice to apply the entire quantity of glass solder required.

As an alternative or in addition, it is also possible for the thickness of the ribbon of the glass solder applied in paste form to be influenced and/or set in an advantageous way by suitable selection of the dispenser needle or the dimensions of the nozzle.

Relatively large surface areas can advantageously likewise be coated with glass solder in a single application operation if the glass solder paste is applied by means of stencil printing, in particular by means of screen printing technology, to the glass pane.

If there is a multiplicity of identical or similar elements, manufacturing can be made inexpensive by first of all applying a glass solder with a predefined surface geometry to a mother pane, which defines or comprises a multiplicity of individual panes, by the glass solder being pre-vitrified and its shape fixed by introduction of energy, in particular as a result of organic constituents being burnt off, individual panes being divided from the mother pane, and the individual pane with pre-vitrified glass solder being inserted into the housing cap and a hermetic join between glass pane and housing cap being produced by the action of heat.

It is advantageous for the individual pane to be divided from the mother glass pane by scoring and breaking or by means of laser cutting.

In order to be able to benefit from all advantages, in particular including the advantages of conventional processes, in the case of geometries which comprise simple and more complex structures, it is also possible for a sintered glass shaped body and pasty glass solder to be applied to the housing body and/or the housing element in order in this way for larger quantities of glass solder to be applied by means of the sintered glass shaped body and complex structures to be applied by means of the pasty glass solder.

Furthermore, housing bodies with a portion of a pre-vitrified glass solder already represent products which can be marketed independently, since a purchaser can place his own housing elements, such as for example windows, lenses or filters, into the housing body and can hermetically secure them therein by heating or the introduction of energy.

A particularly preferred housing body comprises a metallic, sleeve-like cap, a housing element, which preferably includes a glass pane serving as a window, and a glass solder arranged between window and metal cap.

The invention is described in more detail below on the basis of preferred embodiments and with reference to the appended drawings, in which:

BRIEF DESCRIPTION OF THE SEVERAL VIEWS OF THE DRAWINGS

FIG. 6 shows a plan view onto a further embodiment of a rectangular optical cap, FIG. 7 shows a cross-sectional illustration of the rectangular optical cap from FIG. 6 along the plane BB illustrated in FIG. 6, FIG. 8 shows a detail from FIG. 7 denoted by V in FIG. 7, FIG. 9 shows a detail from FIG. 6 denoted by W in FIG. 6, FIG. 10 shows a further embodiment of an optical cap in the form of a partially cross-sectional illustration in a plane which encompasses the longitudinal axis X- of this optical cap, FIG. 11 shows a mother pane with a multiplicity of windows which can each be divided up to form individual windows which can be mounted independently, FIG. 12 shows a detail illustration of the mother pane illustrated in FIG. 11 after the application of glass solder, FIG. 13 shows a cross-sectional illustration through the detail view from FIG. 12 along plane CC.

DETAILED DESCRIPTION OF THE INVENTION

In general, the invention uses a glass solder which can be applied as a shapeable material, preferably a glass solder paste, as the join between, for example, a metal sleeve, which forms a housing body, and, for example, a glass pane, which forms a housing element. With the glass solder in the form of a paste, it is possible for the shape of the glass solder to be very accurately matched to the geometry of the corresponding individual parts.

In this way, it is possible to realize virtually any desired shape of the glass solder, and even complicated surface geometries can be reliably realized in a very accurate form by suitable selection of the corresponding application technique.

Since the shape of the paste can still be altered after it has been applied, the paste can compensate for any dimensional inaccuracies which may still be present. Consequently, the metal sleeve and window can be joined together with a more accurate fit than that provided by the individual components alone.

The position and shape of the glass solder paste is only fixed during a subsequent thermal process, for example after the organic constituents have been burnt off. There is generally no longer any need for an additional operation to produce a separate glass solder shaped body. This process can advantageously also be used to realize optical caps in which the glass window is installed obliquely.

On account of the adhesive force of the paste, the shape of the paste is retained after it has been applied either to the glass pane or preferably to the metal sleeve. There is no longer any likelihood of undesirable slipping of the ribbon of solder prior to the fusion operation, since the respective local quantity of glass solder applied can be metered very accurately and is not adversely affected by the shape of sintered glass solder parts, for example by the minimum thickness required for such parts.

The following text describes specific and preferred embodiments of the invention on the basis of various housing bodies and housing elements, such as standard optical caps for TO52, TO05 bases or also inclined optical caps for TO52 bases.

In the description which follows, identical reference symbols are used for identical or similar parts of the respective embodiments which differ from one another. Furthermore, the illustrations in the various figures are not necessarily to scale, in order not to detract from the clarity and comprehensibility of the essence of the invention.

Figure 1:
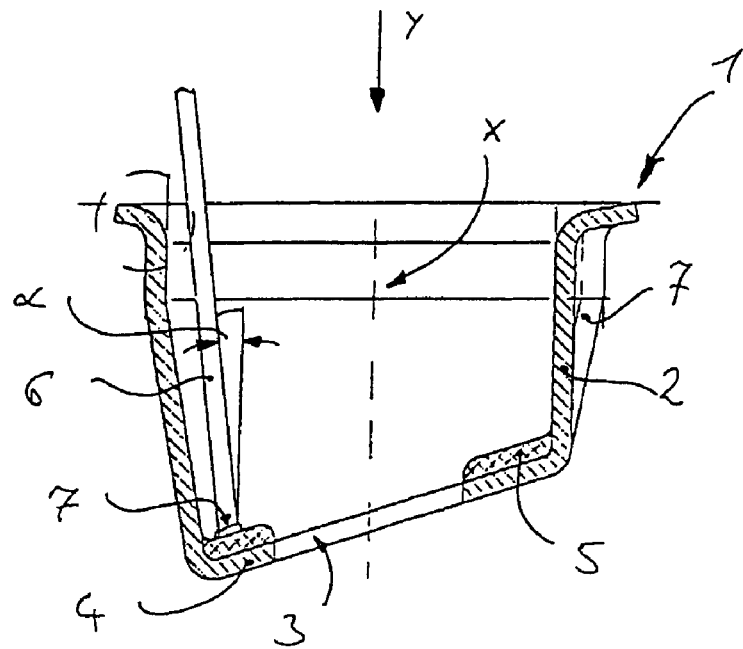
FIG. 1 shows part of a housing body which comprises the optical cap of an optoelectronic component, in the present case a semiconductor laser, in the form of a cross-sectional illustration in the plane of the longitudinal axis X of the optical cap.

FIG. 1 illustrates an optical cap, denoted overall by reference numeral 1, during the production operation. This optical cap 1 comprises a cylindrical or frustoconical metal sleeve 2 with a through-opening 3 in its base surface 4.

The through-opening 3 is suitable for allowing, for example, the light of a laser beam or light under the influence of optical elements, such as for example lenses or filters, to pass through it.

According to the invention, a pasty glass solder layer 5 is applied to the inner side of the base surface 4, in the present example completely surrounding the opening 3 as a ribbon of solder using a needle dispenser.

Figure 2:
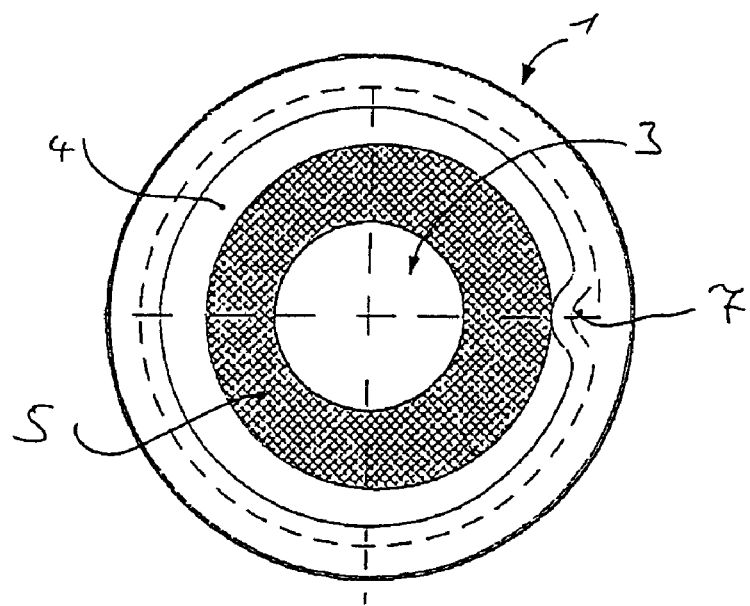
FIG. 2 shows a view into the optical cap illustrated in FIG. 1 in the direction marked by arrow Y in FIG. 1.

The completely continuous circle which is formed as a result can be seen more clearly from FIG. 2, which shows a view into the optical cap illustrated in FIG. 1 from the direction indicated by arrow Y in FIG. 1. As can be seen from FIG. 1, the needle 6 of a needle dispenser moves into the interior of the metal sleeve 3 and applies the pasty glass solder layer 5 to the lower-side end 7 thereof. Needle dispensers of this type are marketed, for example, by Sieghard Schiller GmbH & Co. Kg., Sonnenbuehl, Germany, under the trade name Inline Dispenser.

This makes it possible to achieve lateral tolerances of the glass solder layer applied of ±10 μm, and within these tolerances it is possible to effect further needle adjustments, also allowing multiple coating operations to be carried out next to or on top of one another with the same level of accuracy.

High levels of accuracy are realized using piezo-translational adjustment systems, the adjustment or advancing movement of which can if necessary also be controlled by interferometry. This results in accuracies in the range of less than 1 μm. Preferred thicknesses for the applied glass solder paste start from a solder ribbon thickness of approximately 500 μm, which corresponds approximately to the width of an applied line; there is no restriction to the width of the paste according to the invention.

The application operation comprises controlling or setting the speed of movement of the dispenser needle at least during application of the glass solder paste, the pressure under which the glass solder paste emerges and the time for which the glass solder paste emerges, so that it is in this way possible to set the layer thickness of a particular single application.

In the case of the application operation illustrated in FIG. 1, the needle 6 is tilted through an angle a of approximately 30 degrees±3 degrees relative to the longitudinal axis X of the optical cap 1 and is displaced parallel to the lower base surface 4 along an ellipse which is oblique with respect to the axis X. The inclination of the base surface 4 is also approximately 30 degrees relative to the longitudinal axis X.

Alternatively, the needle 6 can be guided parallel to the longitudinal axis Y of the optical cap illustrated in FIG. 1.

Repeat applications can be carried out in regions or over the entire periphery in order to achieve thicker layers or layers with a thickness which increases in steps.

After the glass solder has been applied, the metal sleeve 2 together with the glass solder layer 5 is heated, with the result that the pasty glass solder layer 5 is vitrified and then fixed in position. In the process, organic constituents of the pasty glass solder are removed.

The result after this process step is a metal sleeve which can be marketed independently and into which, by way of example, further elements can be introduced by an end user and then fixed in position relative to the metal sleeve 2 by heating.

In general terms, the glass solder used may be all glass solders marketed by Schott Glas, for example the glass solders bearing designations 8465, 8467, 8468, 8470, 8471, 8472, 8474 and composite glass solders designated by the numbers G017-002, G017-344, G017-339, G017-340, G017-383, G017-393, G017-334, as well as crystallizing glass solders, such as for example the glass solders 8587, 8593, 8596, 8597, and glass windows can preferably be soldered in as housing elements, these windows each having a higher thermal stability, i.e. a higher temperature Tg, than the corresponding soldering temperature of the glass solder used.

Preferred glasses include special glasses designated D263, AF37, AF45, B270, Borofloat™33 and Borofloat40 produced by Schott Glas, Mainz.

The sleeve-like housing cap preferably consists of a metallic alloy which contains certain amounts of nickel, such as for example the alloy designated NiFe47.

A plurality of optical caps, which are not shown in the figures for the sake of simplicity, can be coated in parallel using multi-needle dispensers. In this case, metal sleeves with identically oriented positions are arranged in multiple carriers and coated in a single operation using multi-needle systems.

A depression 7 in the metal sleeve 3, by interacting with a correspondingly shaped lug in a carrier, allows all the optical caps to be simultaneously positioned in an accurate angular position. Several hundred optical caps can be held on carriers of this type and provided with glass solder paste using multi-needle dispensers operating as steppers.

After the glass solder has been vitrified, it is possible for a housing element, such as for example a pane of glass 8, which is shown in its mounted position in FIG. 10, to be placed into the sleeve 2. The glass pane 8 consists of one of the abovementioned glasses produced by Schott Glas, Mainz.

After the glass pane has been inserted, the arrangement comprising metal sleeve 2 and glass pane 8 can be heated, with the result that the glass solder layer 5 softens and then produces a hermetically sealed soldered join between the pane 8 and the sleeve 2. The glass pane 8 consists of the abovementioned glass designated D263 and produced by Schott Glas, Mainz.

The dispensing of the glass solder using a multi-needle system is preferably carried out using a dispenser head with 2, 4 or 8 needles, which multiplies the productivity of the application by the number of needles.

The offset control of the dispenser needles with respect to one another can be implemented by a needle control station. The resulting needle position correction is realized by adjustment axes which are independent of one another, each needle being equipped with its own independent system of axes.

In a further preferred embodiment, the pre-vitrification operation can be carried out together with the soldering-in operation as part of a single heating step, which has a correspondingly longer duration in order to allow organic constituents to be burnt off. Subsequent cleaning of the assembly formed may, although this is not generally necessary, remove residues of the organic constituents.

Furthermore, as an alternative to round through-openings 3 and glass panes 8, it is also possible to use rectangular, elliptical, oval or polygonal openings 3 and glass panes 8 or openings 3 and glass panes 8 which are specifically shaped for the particular application, or for optical elements 8 to be secured to the housing elements 2.

Figure 3:
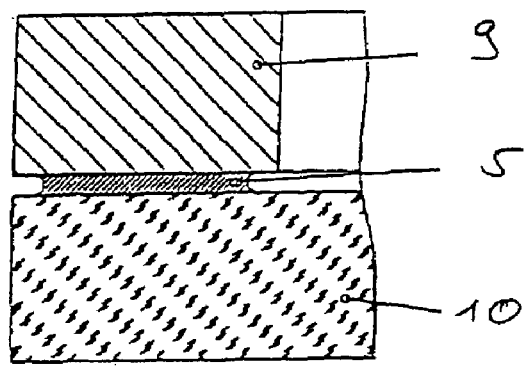
FIG. 3 shows a detail of a cross-sectional view of a rectangular optical cap which is illustrated in its entirety in cross section in FIG. 4.

FIG. 3 illustrates a rectangular metallic carrier 9 to which a glass pane 10 has been secured by means of a glass solder layer 5.

The invention differs from conventional processes, in which hitherto metal layers had to be applied to the glass in order to secure rectangular glass panes of this type to metallic carriers, which were then soldered to the carrier 9 using a metal solder. The process according to the invention no longer requires metal coating of this type, and consequently this form of attachment is very inexpensive and time-efficient.

Nevertheless, for example in the case of housings for optical CCD sensors, the glass pane 10 may have an antireflection coating 11, 12 on one or both of its main surfaces.

Figure 4:
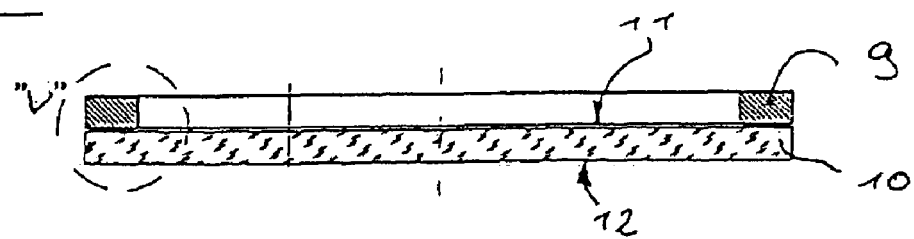
FIG. 4 shows a cross-sectional view through a rectangular optical cap showing the position of the detail illustration from FIG. 3.
Figure 5:
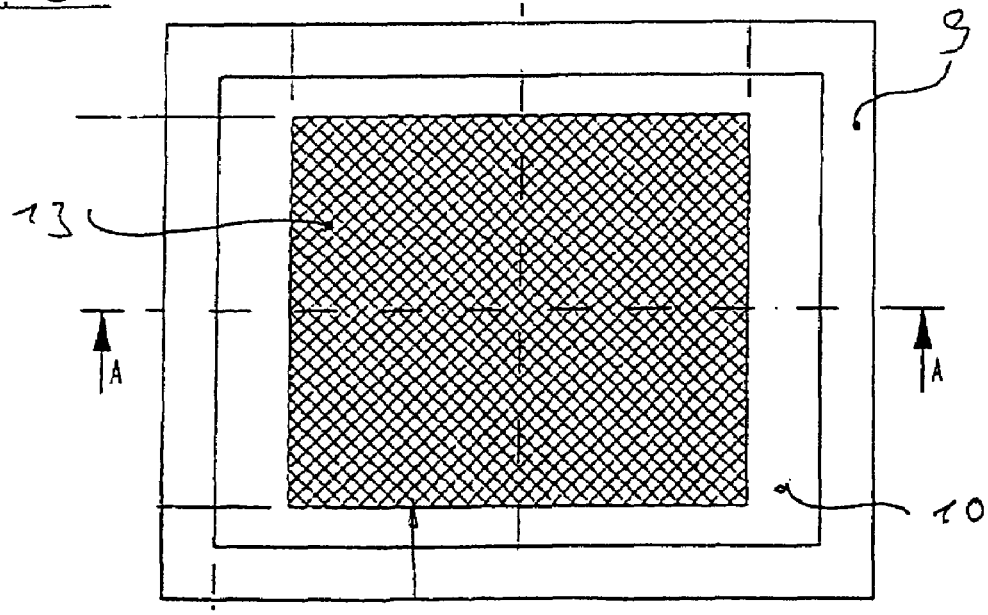
FIG. 5 shows a plan view onto the rectangular optical cap illustrated in FIG. 3 and 4.

It is also possible for scratch proof layers to be applied to the glass pane 10, likewise in conjunction with antireflection coatings. It can be seen from FIG. 5, which shows a plan view of the rectangular optical cap illustrated in FIGS. 3 and 4, that the glass pane 10, once the housing is complete, may, for example, be arranged in front of a CCD array 13.

As an alternative to the CCD array 13, it is also possible for adjustable micromechanical mirror systems, for example of TV and video projection devices, or other elements to be encapsulated with a rectangular input or output window.

FIG. 6 shows a further embodiment of a housing arrangement according to the invention, in which, however, the glass pane 10 does not have the same side dimensions as the metallic carrier 9.

In this embodiment, the metallic carrier 9 has a web 14 which defines a bead 15 in which the glass solder layer 5 is arranged on a support defined by the carrier 9. The glass solder is laterally delimited by the web 14 and the bead 15 and it is also possible to use softer, more free-flowing glass solder with a lower viscosity.

In the embodiment illustrated in FIGS. 6 to 9 it is possible for a metallic edge region 16 to be used for further holding purposes, for example at an external assembly 17. The edge region 16 may, for example, be used for a seal to bear on in the case of recloseable housings or windows or may be applied to external housings by means of further securing techniques, such as for example adhesive bonding or soldering. The metallic carrier may therefore form part of a complex housing structure, in particular a larger housing cap.

As an alternative to being applied to a metallic carrier or a metal sleeve, it is also possible for the glass solder layer 5 to be applied to a glass, as illustrated, for example, in FIGS. 11 to 13.

Furthermore, without restricting the general scope of the invention, it is also possible for glass solder to be applied both to the metallic sleeve 2 or the carrier 9 and to a glass pane or a further housing element.

It is also possible for conventional sintered shaped parts to be used together with the pasty glass solder, in which case, by way of example, more complex shapes can be applied adjacent to a sintered shaped part using a needle dispenser or printed on using the techniques described below.

FIG. 11 shows a mother plate 18 on which a multiplicity of preferably identically shaped window surfaces 19 to 24 are defined by the application of the glass solder layer 5.

Although the glass solder layer 5 can in this embodiment too be applied using multi-needle dispensers, the stencil printing technique, in particular the screen printing technique, is preferred for this purpose.

If screen printing is used, it is likewise possible, by suitable selection of the screen, together with setting of the Theological properties of the glass solder paste, to influence the thickness of the glass solder layer 5.

According to the invention, the glass solder layer 5 can be printed onto a single-piece mother plate 18 in pre-defined form, pre-vitrification can be effected by heating, and it is then possible for the individual panes or the window surfaces 19 to 24 to be divided up along breaking edges 25, 26 and 27, for example by scoring and breaking the mother plate 18.

As an alternative to scoring and breaking, it is also possible to use other cutting or dividing operations, such as for example laser cutting or ultrasound cutting.

As an alternative, it is also possible for a multiplicity of window surfaces 19 to 24 which have already been divided up to be held together by the mother plate 18, which is then designed as a rectangular frame, and this arrangement can be suitably printed and pre-vitrified.

The pre-vitrification can be carried out before or after the respective window surfaces 19 to 24 have been divided into individual window surfaces.

Figure 14:
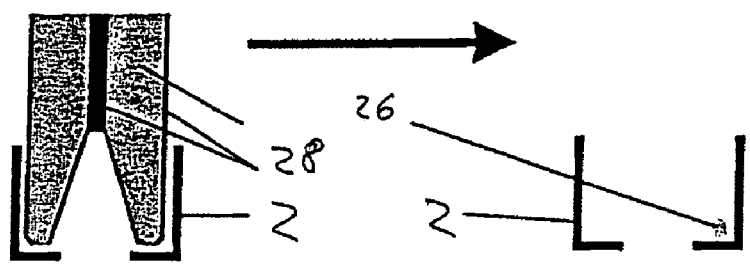
FIG. 14 shows a cross-sectional illustration through an optical cap and a dispenser having an annular or rectangular nozzle before and after application of the glass solder paste.

Furthermore, in a further configuration of the invention, as diagrammatically depicted, for example, in FIG. 14 for the optical cap illustrated in FIG. 10, it is possible for a completely continuous ribbon of solder 26 to be applied by means of just a single application operation. This is done with the aid of a dispenser 27 which has an annular nozzle 28 and preferably also comprises a time/pressure control device for the application operation.

Furthermore, the mother plate 18 illustrated in FIG. 11 can also be printed in steps using a correspondingly shaped rectangular single or multiple nozzle, with a stepper apparatus in each case producing an offset preferably by the width or length of one window surface of the windows 19 to 24.

The processes described above make it possible for even extremely small and complicated glass geometries to be provided with a glass solder layer with the required degree of accuracy, so that they are suitable even for use in the housing of extremely small assemblies, including even individual micromechanical elements, MEMs.

The invention claimed is:

1. A process for producing a housing body for optoelectronic components, comprising the steps of:
    applying a shapeable material to a housing element and/or a metallic housing arrangement, the shapeable material comprising glass solder and organic constituents;
    pre-vitrifying the glass solder by introduction of energy so as to fix a shape of the glass solder and burn off the organic constituents from the shapeable material;
    inserting the housing element into the metallic housing arrangement;
    bringing the housing element and the metallic housing arrangement into contact with the glass solder; and
    introducing energy to the glass solder to produce a hermetic joint between at least a portion of the housing element and the metallic housing arrangement.

2. The process of claim 1, wherein the housing element is a glass window and the metallic housing arrangement is a housing cap.

3. The process claim 2, wherein the shapeable material is applied to at least portion of the glass window and/or the housing cap.

4. The process of claim 2, wherein the shapeable material is applied into the housing cap on a bearing surface arranged in a peripheral region.

5. The process of claim 4, wherein the shapeable material is applied to the bearing surface in a solder region, the solder region being delimited from a remainder of the bearing surface by a bead.

6. The process of claims 2, wherein the shapeable material is applied to a polygonal glass window or housing cap.

7. The process of claim 2, wherein the step of applying comprises screen printing the shapeable material to the glass window.

8. The process of claim 2, wherein the step of inserting the housing element into the metallic housing arrangement comprises:
   applying the shapeable material with a predefined surface geometry to the glass window, wherein the glass window is a mother window having a plurality of individual panes;
   dividing the plurality of individual panes from the mother window;
   inserting the plurality of individual panes into the housing cap; and
   heating the glass pane and the housing cap to produce a hermetic joint.

9. The process of claim 8, wherein the step of dividing the plurality of individual panes from the mother window comprises scoring and breaking or laser cutting.

10. The process of claims 1, wherein the shapeable material is applied to an antireflection coating or scratch proof layer which is arranged on a surface of the housing element.

11. The process of claim 1, wherein the step of applying further comprises shaping of the shapeable material by setting rheological properties of the shapeable material.

12. The process of claim 1, wherein the glass solder is a glass solder paste, and the step of applying comprises applying the shapeable material in metered form by metering apparatus.

13. The process of claim 12, wherein the metering apparatus is an annular or rectangular dispenser provided with a nozzle.

14. The process of claim 12, wherein the metering apparatus sets a ribbon thickness of the shapeable material by selecting a nozzle.

15. The process of claim 1, wherein the step of applying comprises pressing the shapeable material out of a needle under pressure/time control.

16. The process of claim 1, wherein the step of applying further comprises shaping the shapeable material by applying a ribbon thickness of the shapeable material more than once.

17. The process of claim 1, wherein the step of applying further comprises shaping the shapeable material by a screen and/or a printing stencil.

18. The process of claim 1, wherein the step of applying the shapeable material comprises applying a sintered glass shaped body and glass solder paste to the housing element and/or the metallic housing arrangement.

19. The process of claim 1, wherein the step of applying further comprises setting a speed of displacement of a dispenser needle during application of the shapeable material.

20. A housing body for optoelectronic components comprising:
   a metallic cap having a sleeve shape;
   a housing element having a glass pane for serving as a window; and
   a glass solder arranged between the housing element and the metallic cap, wherein the metallic cap has an interior portion with a support running around an end side, the glass solder being arranged on the support, wherein the support has a plane that is inclined relative to a longitudinal axis of the housing element, and wherein the glass pane is fastened to the support by the glass solder so that the glass pane is arranged obliquely with respect to the longitudinal axis.

21. The housing of claim 20, further comprising an optical cap for encapsulating the optoelectronic components.

22. The housing body of claim 21, wherein the glass pane is substantially congruent with an inner end face of the metallic cap, and an end side of the glass pane is in contact with an inner side of the inner end face of the metallic cap.

23. The housing body of claim 20, wherein the glass pane has an antireflection coating and/or a scratch proof layer and wherein the glass pane is soldered onto the support.

24. The housing body of claim 20, wherein the housing element comprises an optical element selected from the group consisting of a lens, a cylindrical lens, and a spherical lens.

* * * * *